US008346514B2

(12) United States Patent
Lape et al.

(10) Patent No.: US 8,346,514 B2
(45) Date of Patent: Jan. 1, 2013

(54) METHOD AND SYSTEM FOR DETERMINING THE NUMBER OF WEDGES FOR A SLOT IN A DYNAMOELECTRIC MACHINE

(75) Inventors: Brock M. Lape, Clifton Park, NY (US); Benjamin A. Mancuso, Schenectady, NY (US); Michael C. Villani, Rennselaer, NY (US)

(73) Assignee: General Electric Company, Schenectady, NY (US)

( * ) Notice: Subject to any disclaimer, the term of this patent is extended or adjusted under 35 U.S.C. 154(b) by 410 days.

(21) Appl. No.: 12/604,624

(22) Filed: Oct. 23, 2009

(65) Prior Publication Data

US 2011/0098984 A1 Apr. 28, 2011

(51) Int. Cl.
*G06F 17/50* (2006.01)

(52) U.S. Cl. .......................................................... 703/1

(58) Field of Classification Search ....................... 703/1
See application file for complete search history.

(56) References Cited

U.S. PATENT DOCUMENTS

| | | | | |
|---|---|---|---|---|
| 6,218,759 | B1 | 4/2001 | Blakelock et al. | |
| 6,331,745 | B2 | 12/2001 | Blakelock et al. | |
| 6,377,657 | B1 * | 4/2002 | Scholz | 378/118 |
| 6,421,914 | B1 | 7/2002 | Iversen et al. | |
| 6,584,680 | B2 | 7/2003 | Iversen et al. | |
| 6,708,395 | B2 | 3/2004 | Pezzano et al. | |
| 7,112,909 | B2 * | 9/2006 | Swartout et al. | 310/214 |
| 2002/0050063 | A1 | 5/2002 | Iversen et al. | |
| 2009/0031556 | A1 | 2/2009 | Lape et al. | |

OTHER PUBLICATIONS

Richard L. Nailen, "Slot wedges-essential, yet often misunderstood," 2006, downloaded from the internet from http://www.highbeam.com/doc/1P3-1029380601.html, pp. 1-5.*

* cited by examiner

*Primary Examiner* — Dwin M Craig
*Assistant Examiner* — Russ Guill
(74) *Attorney, Agent, or Firm* — James W. Pemrick; Ernest G. Cusick; Frank A. Landgraff

(57) ABSTRACT

A method and system is provided for calculating a number of wedges for a slot in a dynamoelectric machine. The method includes the steps of providing a computer that is programmed to perform a method for calculating, which includes the steps of acquiring a length of the slot, acquiring a length of one or more wedges, and calculating a number of wedges required for the slot. The number of wedges required for the slot is displayed on a display device.

14 Claims, 7 Drawing Sheets

108
106
240
230
210
210
220

METHOD AND SYSTEM FOR DETERMINING THE NUMBER OF WEDGES FOR A SLOT IN A DYNAMOELECTRIC MACHINE

BACKGROUND OF THE INVENTION

This invention relates generally to dynamoelectric machines and more particularly, to a method and system for determining the number of wedges required for a slot in the dynamoelectric machine.

Armature windings, also known as stator bar or rotor windings, are routinely inspected in at least some known electrical power generators, to verify their operation. In some known generators, a stator yoke in the generator surrounds an armature core and partially encloses the armature windings. The stator windings are formed from a plurality of copper conductors that are wound in the armature to form loops. The armature windings may be arranged within a stator slot in such a manner that desired voltage and current characteristics may be maintained by the generator during operation.

At least one known generator includes a wedge system to induce a radial retaining force (RRF) to the stator from wedges to facilitate reducing movement of the stator bar windings within the stator slot. However, if the wedge system itself becomes loose, the amount of RRF is reduced such that the stator bar windings may move during operation. Over time, the relative motion of the stator bar windings cause damage to insulation surrounding the stator bar wedges, and/or a potential stator bar winding failure through electrical shorts to ground. Accordingly, within known generators, the wedge system is periodically inspected to determine if any stator bar winding movement within the stator slots exceeds predetermined tolerances. Some machines may need a rewind operation where the windings and wedge system are replaced.

Currently, several known methods of determining the number of wedges per slot are employed. One known method involves hand calculations resulting in many different lengths of wedges. Another known method involves manually selecting wedges of various lengths and installing them until the slot is filled. All the previously known methods result in a high degree of slot-to-slot variation on the number and length of wedges used.

BRIEF DESCRIPTION OF THE INVENTION

In one aspect of the invention, a method is provided for calculating a number of wedges for a slot in a dynamoelectric machine. The method includes the steps of providing a computer that is programmed to perform a method for calculating, which includes the steps of acquiring a length of the slot, acquiring a length of one or more wedges, and calculating a number of wedges required for the slot. The number of wedges required for the slot is displayed on a display device.

In another aspect of the invention, a system is provided for calculating a number of wedges for a slot in a dynamoelectric machine. The system includes a computer programmed to perform the steps of, acquiring a length of the slot, acquiring a length of one or more wedges, and calculating a number of wedges required for the slot. A display device can be used for displaying the number of wedges required for the slot.

DETAILED DESCRIPTION OF THE INVENTION

A dynamoelectric machine is defined as any apparatus that converts electrical energy between the electrical and the mechanical state by means of an electromagnetic effect. Windings are employed in the armature and field of a dynamoelectric machine, and may be held in place by a retaining system incorporating various components (e.g., wedges, ripple springs, etc.).

Figure 1:
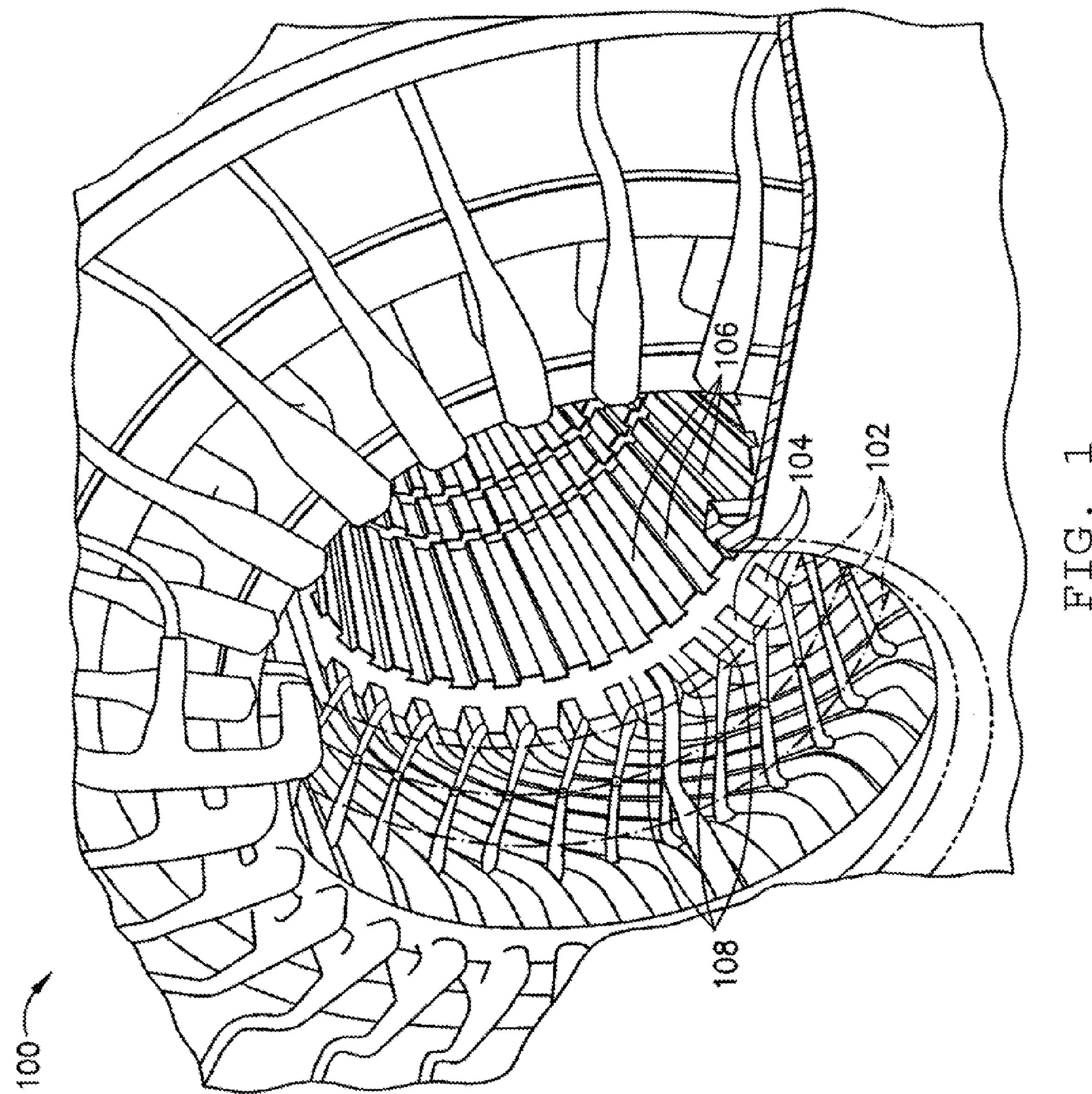
FIG. 1 is a perspective end illustration of an exemplary electric generator.

FIG. 1 is a perspective end view of an exemplary electric generator 100. A rotor 102 is transparently represented by dashed lines. A plurality of stator bar windings 104 are positioned in slots 106 defined around an inner circumference of a stator core 108. In the exemplary embodiment, stator bar windings 104 are formed from a plurality of flat bar conductors or stator bars that are coupled together to form a predetermined winding path through winding 104. In one embodiment, the stator bars are fabricated from copper.

Figure 2:
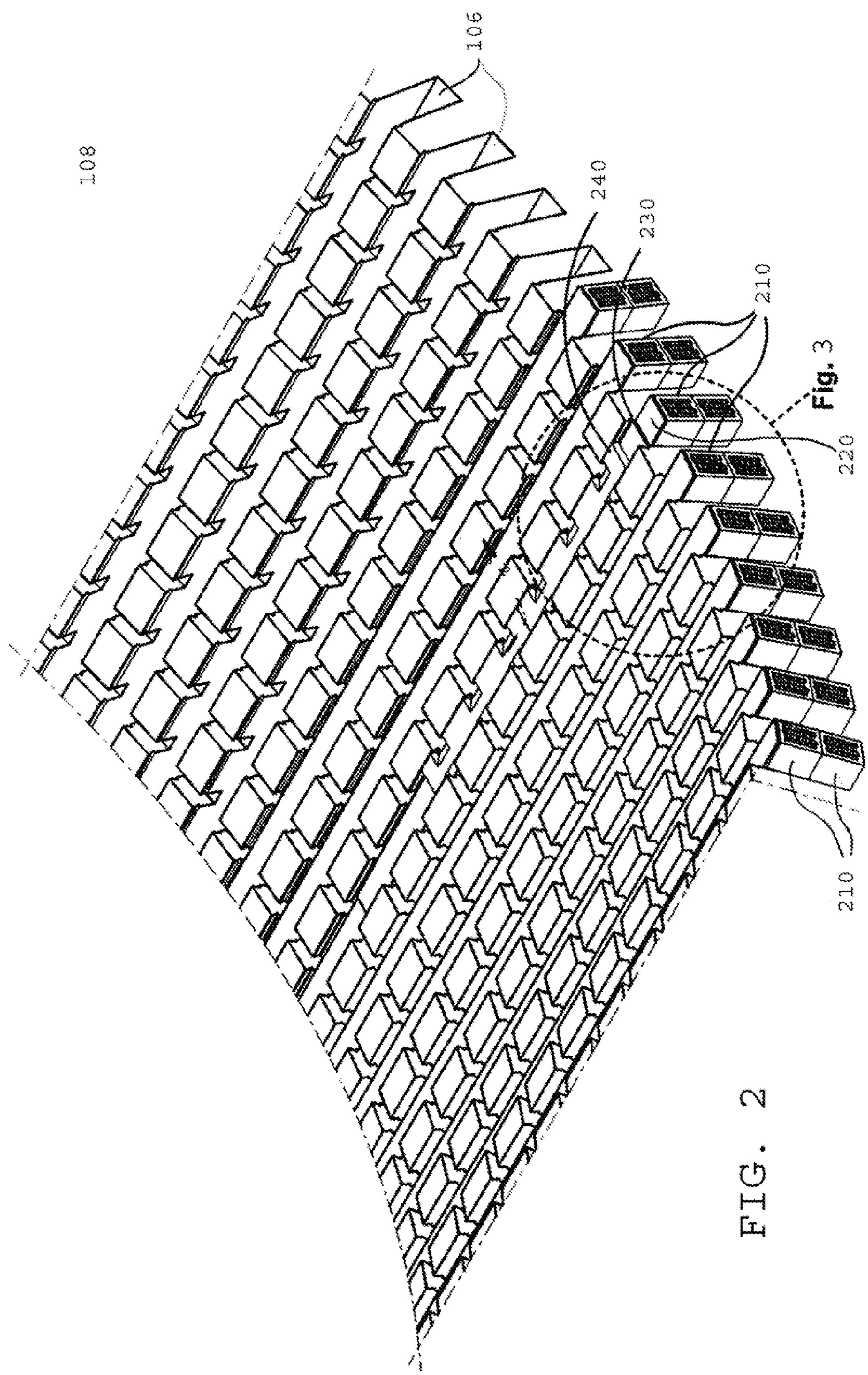
FIG. 2 is a partial perspective illustration of a portion of the stator core in the electric generator stator shown in FIG. 1.

FIG. 2 illustrates a partial, perspective illustration of a stator core 108. The stator core 108 has a plurality of slots 106, generally extending in an axial direction, which contain the windings 210. As one example, two windings 210 may be contained within each slot 106. The windings 210 are housed in the lower portion of the slots 106. Various filler strips 220, slides 230 and wedges 240 may be installed above the windings 210.

Figure 3:
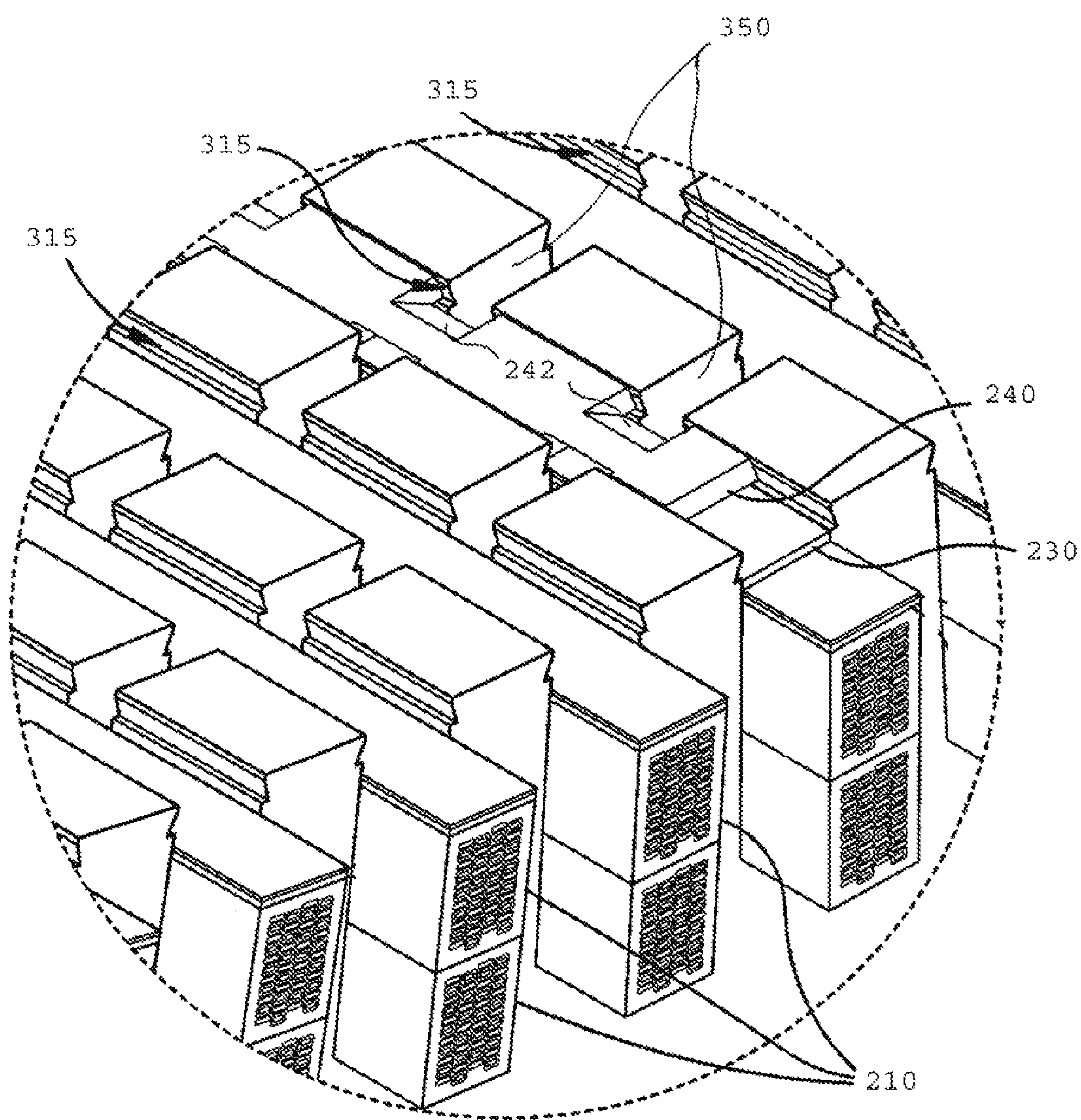
FIG. 3 is an enlarged partial perspective illustration of a portion of the stator core shown in FIG. 2.

FIG. 3 is an enlarged, partial perspective illustration of a stator core, and shows the interrelation between the slots 106, slides 230 and wedges 240. The dovetail shaped wedge 240 engages a dovetail groove 315 and a slide 230 is normally driven under the wedge 240. The stator core 108 may be comprised of many laminations of magnetic steel or iron material. The laminations form groups, and these groups are separated by spacers. The spacers define cooling vent slots 350, which are generally orthogonal to the slots 106. The cooling vents 350 between the groups of laminations allow for ventilation and cooling of the stator core. Typically, the vent gaps 242 in the wedges 240 are aligned with the cooling vents 350.

Figure 4:
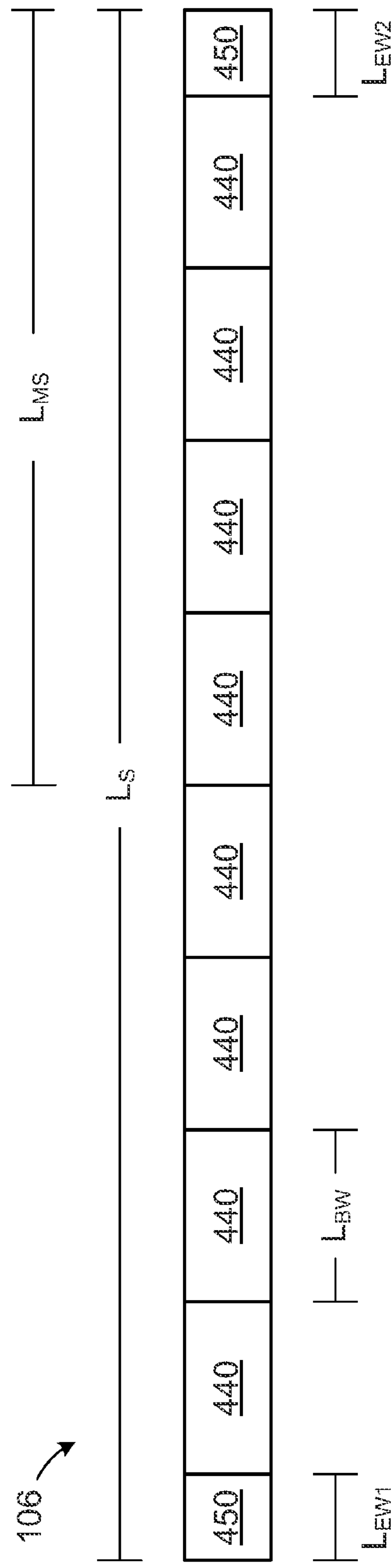
FIG. 4 is a simplified, top illustration of a stator slot filled with body wedges and end wedges.

FIG. 4 illustrates a simplified, top plan view of one slot 106 filled with body wedges 440, and end wedges 450. The total length of the slot $L_S$, is the distance from one end of the slot to the other in an axial direction. The length of the body wedges and the end wedges are $L_{BW}$ and $L_{EW}$, respectively. In this example, it can be seen that there are eight body wedges 440 of length $L_{BW}$, and two end wedges 450 of length $L_{EW}$. The various dimensions vary by specific application, but as one example, the core length or slot length could be $L_S$=67.5". The body wedge length might be $L_{BW}$=6.75", and the end wedges could also be $L_{EW}$=6.75". However, it is common for the end wedges 450 to have a different length than the body wedges 440, and each opposing end wedge may have a different length as well.

Figure 5:
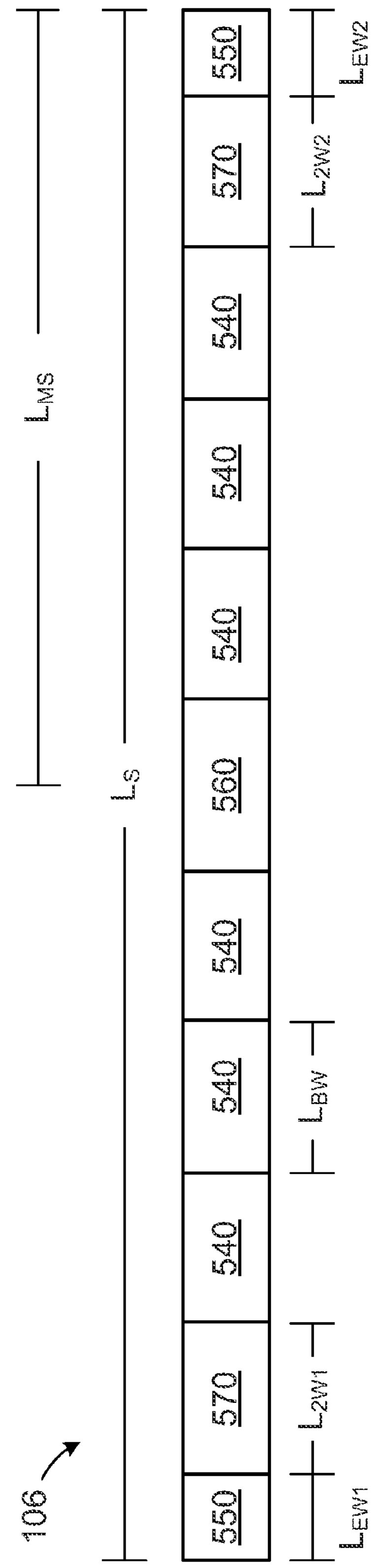
FIG. 5 is a simplified, top illustration of a stator slot filled with body wedges and end wedges.

FIG. 5 illustrates a simplified, top plan view of one slot 106 filled with body wedges 540, end wedges 550 and a center wedge 560. A second wedge 570 may also be utilized. However, in some applications the second wedge 570 may be replaced with a body wedge 540. The total length of the slot $L_S$, is the distance from one end of the slot to the other in the axial direction. The length of the body wedges, end wedges and the center wedge are $L_{BW}$, $L_{EW}$ and $L_{CW}$, respectively. The middle spacing distance $L_{MS}$, is the distance from the end of the slot to the midpoint. In this example, it can be seen that there are eight body wedges 540 of length $L_{BW}$, two end wedges 550 of length $L_{EW}$ and one center wedge of length $L_{CW}$. The center wedge 550 can be used for alignment of the vent gaps 242 in body wedges 540, 240 to the cooling vents 350 (see FIG. 3).

Figure 6:
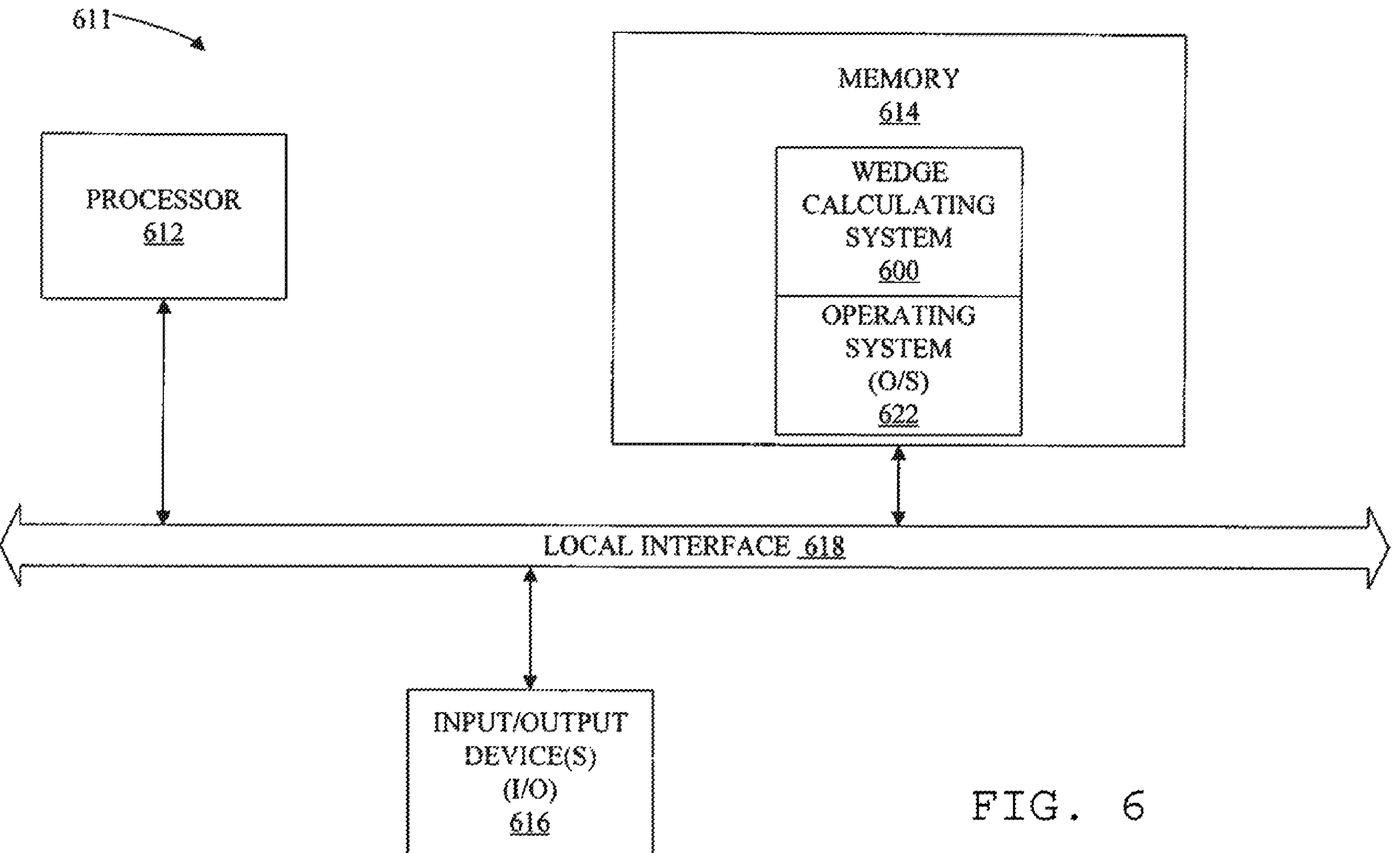
FIG. 6 is a block diagram of a wedge calculating system according to aspects of the present invention.

The system for determining the number of wedges for a slot in a dynamoelectric machine, according to aspects of the present invention, can be implemented in software (e.g., firmware), hardware, or a combination thereof. In the currently contemplated best mode, the system is implemented in software, as an executable program, and is executed by a special or general purpose digital computer, such as a personal computer (PC; IBM-compatible, Apple-compatible, or otherwise), workstation, minicomputer, or mainframe computer. An example of a general purpose computer that can implement the system of the present invention is shown in FIG. 6. In FIG. 6, the wedge calculating system is denoted by reference numeral 600.

Generally, in terms of hardware architecture, as shown in FIG. 6, the computer 611 includes a processor 612, memory 614, and one or more input and/or output (I/O) devices 616 (or peripherals) that are communicatively coupled via a local interface 618. The local interface 618 can be, for example but not limited to, one or more buses or other wired or wireless connections, as is known in the art. The local interface 618 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

The processor 612 is a hardware device for executing software, particularly that stored in memory 614. The processor 612 can be any custom made or commercially available processor, a central processing unit (CPU), an auxiliary processor among several processors associated with the computer 611, a semiconductor based microprocessor (in the form of a microchip or chip set), a macroprocessor, or generally any device for executing software instructions. Examples of some suitable commercially available microprocessors are as follows: a PA-RISC series microprocessor from Hewlett-Packard Company, an 80×86 or Pentium series microprocessor from Intel Corporation, a PowerPC microprocessor from IBM, a Sparc microprocessor from Sun Microsystems, Inc, or a 68xxx series microprocessor from Motorola Corporation.

The memory 614 can include any one or combination of volatile memory elements (e.g., random access memory (RAM, such as DRAM, SRAM, SDRAM, etc.)) and nonvolatile memory elements (e.g., ROM, hard drive, tape, CDROM, etc.). Moreover, the memory 614 may incorporate electronic, magnetic, optical, and/or other types of storage media. Note that the memory 614 can have a distributed architecture, where various components are situated remote from one another, but can be accessed by the processor 612.

The software in memory 614 may include one or more separate programs, each of which comprises an ordered listing of executable instructions for implementing logical functions. In the example of FIG. 6, the software in the memory 614 includes the wedge calculating system 600 in accordance with the present invention and a suitable operating system (O/S) 622. A nonexhaustive list of examples of suitable commercially available operating systems 622 is as follows: (a) a Windows operating system available from Microsoft Corporation; (b) a Netware operating system available from Novell, Inc.; (c) a Macintosh operating system available from Apple Computer, Inc.; (e) a UNIX operating system, which is available for purchase from many vendors, such as the Hewlett-Packard Company, Sun Microsystems, Inc., and AT&T Corporation; (d) a LINUX operating system, which is freeware that is readily available on the Internet; (e) a run time Vxworks operating system from WindRiver Systems, Inc.; or (f) an appliance-based operating system, such as that implemented in handheld computers or personal data assistants (PDAs) (e.g., PalmOS available from Palm Computing, Inc., and Windows CE available from Microsoft Corporation). The operating system 622 essentially controls the execution of other computer programs, such as the wedge calculating system 600, and provides scheduling, input-output control, file and data management, memory management, and communication control and related services.

The wedge calculating system 600 is a source program, executable program (object code), script, or any other entity comprising a set of instructions to be performed. When a source program, then the program needs to be translated via a compiler, assembler, interpreter, or the like, which may or may not be included within the memory 614, so as to operate properly in connection with the O/S 622. Furthermore, the wedge calculating system 600 can be written as (a) an object oriented programming language, which has classes of data and methods, or (b) a procedure programming language, which has routines, subroutines, and/or functions, for example but not limited to, C, C++, Pascal, Basic, Fortran, Cobol, Pert, Java, and Ada, or (c) configured as a spreadsheet having multiple inputs and multiple outputs; the outputs calculated by predetermined mathematical operations. In the currently contemplated best mode of practicing the invention, the wedge calculating system 600 is configured as a spreadsheet having multiple inputs and multiple outputs; the outputs calculated by predetermined mathematical operations.

The I/O devices 616 may include input devices, for example but not limited to, a keyboard, mouse, scanner, microphone, etc. Furthermore, the I/O devices 616 may also include output devices, for example but not limited to, a printer, display, etc. Finally, the I/O devices 616 may further include devices that communicate both inputs and outputs, for instance but not limited to, a modulator/demodulator (modem; for accessing another device, system, or network), a radio frequency (RF) or other transceiver, a telephonic interface, a bridge, a router, etc.

If the computer 611 is a PC, workstation, or the like, the software in the memory 614 may further include a basic input output system (BIOS) (omitted for simplicity). The BIOS is a set of essential software routines that initialize and test hardware at startup, start the O/S 622, and support the transfer of data among the hardware devices. The BIOS is stored in ROM so that the BIOS can be executed when the computer 611 is activated.

When the computer 611 is in operation, the processor 612 is configured to execute software stored within the memory 614, to communicate data to and from the memory 614, and to generally control operations of the computer 611 pursuant to the software. The wedge calculating system 600 and the O/S 622, in whole or in part, but typically the latter, are read by the processor 612, perhaps buffered within the processor 612, and then executed.

When the wedge calculating system 600 is implemented in software, as is shown in FIG. 6, it should be noted that the wedge calculating system 600 can be stored on any computer readable medium for use by or in connection with any computer related system or method. In the context of this document, a computer readable medium is an electronic, magnetic, optical, or other physical device or means that can contain or store a computer program for use by or in connection with a computer related system or method. The wedge calculating system 600 can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed or stored, as the program can be electronically captured, via for instance optical scanning of the paper or other medium, then compiled, interpreted or otherwise processed in a suitable manner if necessary, and then stored in a computer memory.

In an alternative embodiment, where the wedge calculating system 600 is implemented in hardware, the wedge calculating system can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

The number of wedges, and their respective lengths, required to fill slot 106 can be determined by the method and system according to aspects of the present invention. The method described below, utilizes a series of nested statements to optimize the wedge design by selecting the longest possible wedge (or by using the size wedge available) that will fit evenly in slot 106. If the only possible solution is a body wedge length of one vent spacing, a center wedge may be added to reduce the quantity of body wedges.

Table 1 lists the various inputs and outputs of the equations used to calculate the length and quantity of wedges required. For core inputs, $N_{CV}$ is the number of cooling vents 350 present in one slot 106. The core length, $L_S$, is the length of one slot 106. The middle spacing, $L_{MS}$, is the combined length of a punching packet and cooling vent in the center section of the core. The end packet length is $L_{EP}$ and the cooling vent length is $L_{CV}$. For wedge inputs, $E_{BW}$ is the maximum available body wedge length, and the locking or end wedge length is $E_{LW}$. Wedges can come in multiple lengths, and there may be multiple sizes available for installation. The outputs of the method yield the maximum body wedge length $L_{BW}$, end wedge lengths $L_{EW1}$ and $L_{EW2}$, total number of body wedges $N_{BW}$ for one slot, and the second wedge lengths, $L_{2W1}$ and $L_{2W2}$, if desired. In addition, the various inputs below can be obtained manually or by measuring using physical or electronic devices, and the results may be stored in a medium which can be accessed by the method and system herein described.

TABLE 1

| INPUTS | | OUTPUTS | |
|---|---|---|---|
| CORE | | WEDGE | |
| Number of Cooling Vents | $N_{CV}$ | Body wedge length | $L_{BW}$ |
| Core Length | $L_S$ | End Wedge length | $L_{EW1}/L_{EW2}$ |
| End Spacing | $L_{ES}$ | Number of body wedges | $N_{BW}$ |
| Middle Spacing | $L_{MS}$ | Locking Wedge Length | $L_{EW}$ |
| End Packet Length | $L_{EP}$ | Second Wedge Length | $L_{2W1}/L_{2W2}$ |
| Cooling Vent Length | $L_{CV}$ | | |
| WEDGE | | | |
| Body Wedge Length (max) | $E_{BW}$ | | |
| Locking Wedge Length | $E_{LW}$ | | |

The first step in the method, according to aspects of the present invention, is to calculate the end spacing, $L_{ES}$. The end spacing is defined as the axial length of the last packet of core laminations plus one half the length of the cooling vent. The end packet length is defined as the axial length of the outboardmost core laminations up to the first cooling vent. The end spacing can be calculated with the following equation:

$$L_{ES}=L_{EP}+L_{CV}/2 \quad \text{(Equation 1)}$$

The next step is to calculate the middle spacing, $L_{MS}$. The middle spacing is defined as the axial length of any one of the packets of core laminations in the middle section of the core plus the length of one cooling vent. The middle spacing can be calculated by the following equation:

$$L_{MS}=((L_S-(2*L_{ES}))/(N_{CV}-1)) \quad \text{(Equation 2)}$$

Alternatively, the middle spacing could be manually measured using physical or electronic devices. For example, a tape measure could be used to measure the middle spacing. The length of the slot, $L_S$, can also be manually measured using physical or electronic devices.

After the middle spacing is determined, the end or locking wedge length and maximum body wedge length can be determined by using equations 3 and 4, respectively.

$$L_{EW}=\text{Rounddown}((E_{LW}-L_{ES})/L_{MS})*L_{MS}+L_{ES} \quad \text{(Equation 3)}$$

$$L_{BW}=\text{Rounddown}(E_{BW}/L_{MS})*L_{MS} \quad \text{(Equation 4)}$$

Two types of locking wedges can be accounted for in the method, according to aspects of the present invention. One type of wedge is a mechanical locking wedge, which uses some form of mechanical tab inserted into the core cooling vent to lock the wedge. Another type of wedge is a non-mechanical locking wedge, which relies on an adhesive or other retention means, other than physical insertion of a projection into the cooling vent, to lock the wedge. The optimization process or method for each style wedge is illustrated in FIGS. 7 and 8.

Figure 7:
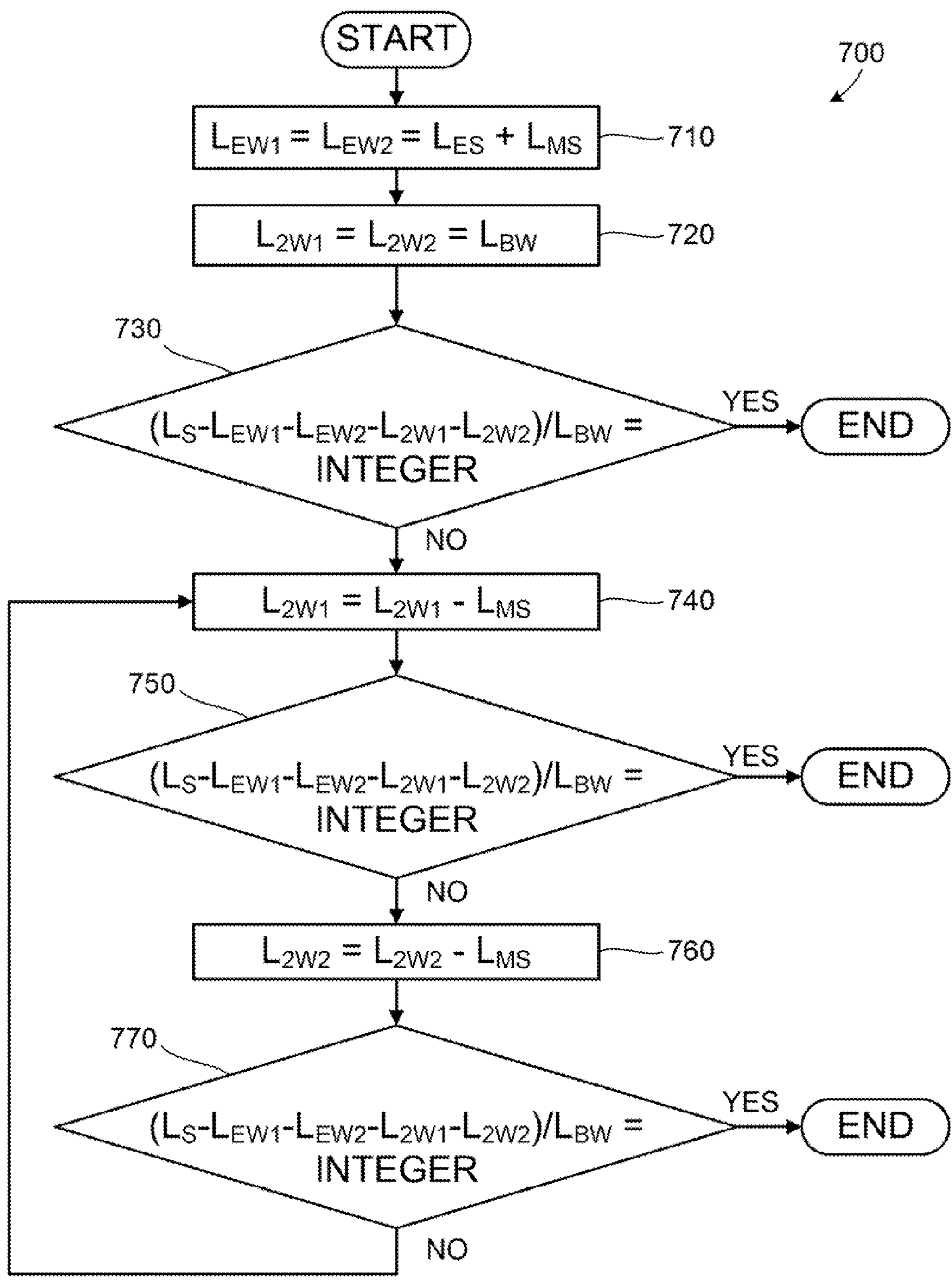
FIG. 7 is a flowchart illustrating some of the process steps to determine the number of mechanical-style wedges required for a slot in a dynamoelectric machine, according to aspects of the present invention.

FIG. 7 illustrates a process 700 to calculate and optimize the number of mechanical-style locking wedges. In step 710, the end wedge length, $L_{EW1}$ and $L_{EW2}$, can be set equal to the end spacing distance, $L_{ES}$, plus the middle spacing distance, $L_{MS}$. In step 720, the second wedge lengths, $L_{2W1}$ and $L_{2W2}$, are set equal to the maximum body wedge length, $E_{BW}$. In step 730, it is decided if the estimated number of body wedges is an integer value. If the answer is yes, then the process is finished. If the answer is no, then the process continues to step 740. In step 740, the second wedge length, $L_{2W1}$, is set equal to the second wedge length, $L_{2W1}$, minus the middle spacing distance, $L_{MS}$. In step 750, it is decided if the estimated number of body wedges is an integer value. If the answer is yes, then the process is finished. If the answer is no, then the process continues to step 760. In step 760, the second wedge length, $L_{2W2}$. is set equal to the second wedge length, $L_{2W2}$, minus the middle spacing distance, $L_{MS}$. In step 770, it is decided if the estimated number of body wedges is an integer value. If the answer is yes, then the process is finished. If the answer is no, then the process loops back to step 740 and repeats.

Figure 8:
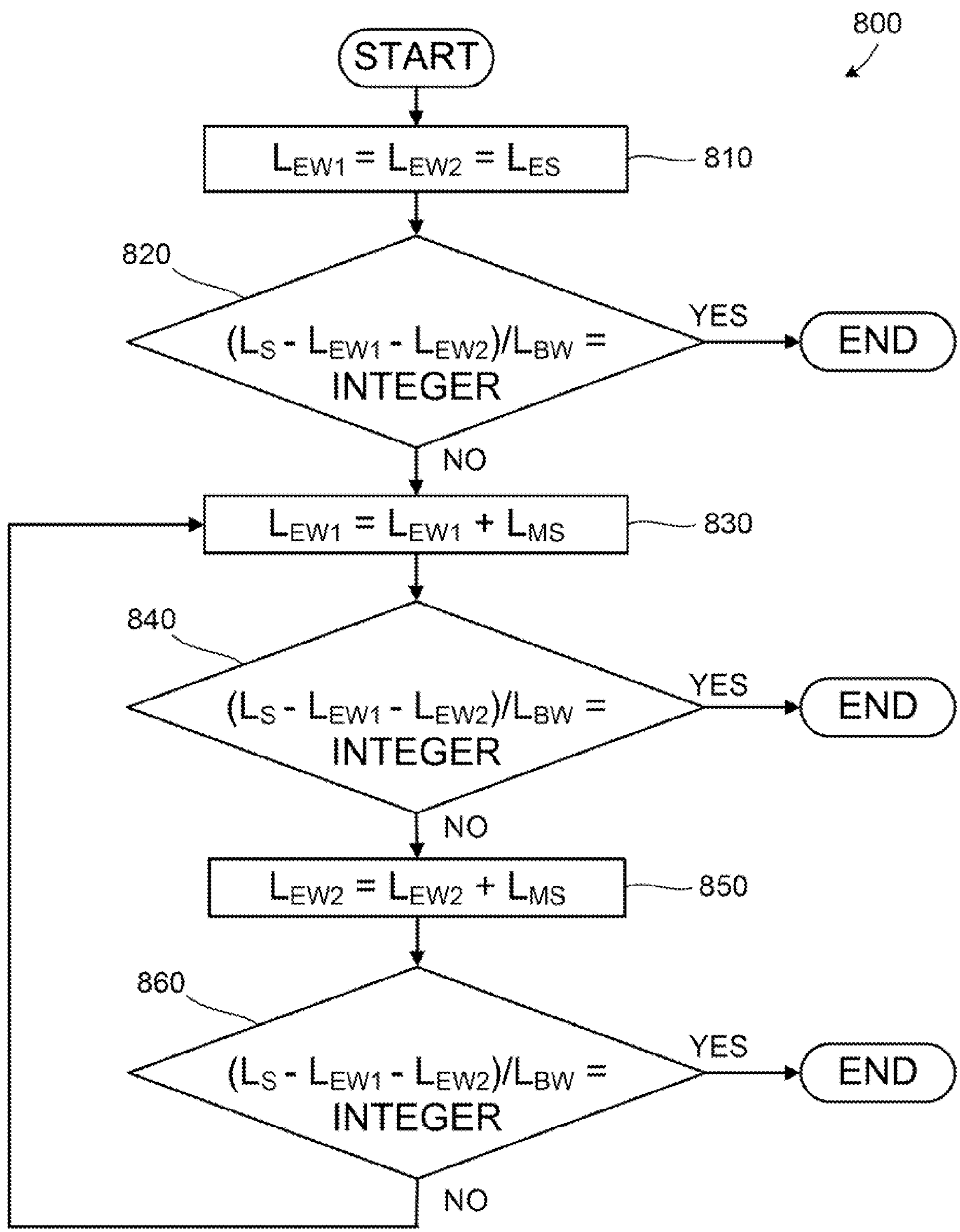
FIG. 8 is a flowchart illustrating some of the process steps to determine the number of non-mechanical style wedges required for a slot in a dynamoelectric machine, according to aspects of the present invention.

FIG. 8 illustrates a process 800 to calculate and optimize the number of non-mechanical-style locking wedges. In step 810, the end wedge lengths, $L_{EW1}$ and $L_{EW2}$, are set equal to the end spacing distance, $L_{ES}$. In step 820, it is decided if the estimated number of body wedges is an integer value. If the answer is yes, then the process is finished. If the answer is no, then the process continues to step 830. In step 830, the end wedge length, $L_{EW1}$, is set equal to the end wedge length, $L_{EW1}$, plus the middle spacing distance, $L_{MS}$. In step 840, it is decided if the estimated number of body wedges is an integer value. If the answer is yes, then the process is finished. If the answer is no, then the process continues to step 850. In step 850, end wedge length, $L_{EW2}$, is set equal to the end wedge length, $L_{EW2}$, plus the middle spacing distance, $L_{MS}$. In step 860, it is decided if the estimated number of body wedges is an integer value. If the answer is yes, then the process is finished. If the answer is no, then the process loops back to step 830 and repeats.

The number of body wedges can now be determined by using equation 5.

$$N_{BW} = \left(\frac{L_S - L_{EW1} - L_{EW2} - L_{2W1} - L_{2W2.}}{L_{BW}}\right) \quad \text{(Equation 5)}$$

In equation 5, $N_{BW}$ is the total number of body wedges required for one slot, $L_s$ is the length of the slot, $L_{EW1}$ and $L_{EW2}$ are the lengths of the two end wedges, $L_{2W1}$ and $L_{2W2}$ are the length of the two second wedges, if required. $L_{BW}$ is the maximum calculated acceptable body wedge length. For non-mechanical style wedges, the values of the two second wedges, $L_{2W1}$ and $L_{2W2}$, can be set equal to zero.

The above equations illustrate one of many variations of calculating the number and length of body and end wedges required to fill a slot in a dynamoelectric machine. Any suitable equation may be substituted, or the order of the calculations may be varied as desired in the specific application.

While the invention has been described in terms of various specific embodiments, those skilled in the art will recognize that the invention can be practiced with modification within the spirit and scope of the claims.

What is claimed is:

1. A method for calculating a number of wedges for a slot in a dynamoelectric machine comprising:

(A) acquiring a length of said slot;

(B) acquiring a length of one or more wedges;

(C) calculating, using a computer, a number of said one or more wedges required for said slot using the length of the slot and the length of the one or more wedges;

(D) calculating, using a computer, an end spacing distance ($L_{ES}$) with the following equation:

$$L_{ES}=L_{EP}+L_{CV}/2$$

where, $L_{EP}$ is an end packet length, $L_{CV}$ is a cooling vent length; and wherein, the number of said one or more wedges required for said slot is communicated to a display device and then displayed on the display device.

2. The method according to claim 1, said method for calculating further comprising the steps of:

acquiring a number of vents in said slot;

acquiring a length of said vents;

acquiring a core length;

acquiring the end spacing distance;

acquiring a middle spacing distance;

calculating a body wedge length using the length of the one or more wedges and the middle spacing distance;

calculating at least one end wedge length using the end spacing distance and the middle spacing distance; and calculating a number of body wedges required for said slot, using the length of the slot, the body wedge length and the end wedge length.

3. The method according to claim 2, said method for calculating further comprising the steps of:

calculating a center wedge length, by using the body wedge length and the end wedge length.

4. The method according to claim 1, said method for calculating further comprising calculating a middle spacing distance ($L_{MS}$) with the following equation:

$$L_{MS}=((L_S-(2*L_{ES}))/(N_{CV}-1))$$

where, $L_S$ is the length of said slot;

$L_{ES}$ is an end spacing distance; and $N_{CV}$ is a number of cooling vents in said slot.

5. The method according to claim 4, said method for calculating further comprising a determining step to determine if said number of wedges is an integer value.

6. The method according to claim 5, said method for calculating further comprising calculating a number of body wedges ($N_{BW}$) with the following equation:

$$N_{BW} = \left(\frac{L_S - L_{EW1} - L_{EW2} - L_{2W1} - L_{2W2.}}{L_{BW}}\right).$$

where, $L_S$ is the length of said slot;

$L_{EW1}$ is the length of an end wedge;

$L_{EW2}$ is the length of an end wedge;

$L_{2W1}$ is the length of a second wedge;

$L_{2W2}$ is the length of a second wedge;

$L_{BW}$ is a body wedge length; and wherein, $L_{2W1}$ and $L_{2W2}$ are set equal to zero if no second wedges are present.

7. The method according to claim 4, further comprising a determining step to determine if said number of wedges is an integer value.

8. The method according to claim 7, said method for calculating further comprising calculating a number of body wedges ($N_{BW}$) with the following equation:

$$N_{BW} = \left(\frac{L_S - L_{EW1} - L_{EW2} - L_{2W1} - L_{2W2.}}{L_{BW}}\right)$$

where, $L_S$ is the length of said slot;

$L_{EW1}$ is the length of an end wedge;

$L_{EW2}$ is the length of an end wedge;

$L_{2W1}$ is the length of a second wedge;

$L_{2W2}$ is the length of a second wedge;

$L_{BW}$ is a body wedge length; and wherein, $L_{2W1}$ and $L_{2W2}$ are set equal to zero if no second wedges are present.

9. A system for calculating a number of wedges for a slot in a dynamoelectric machine comprising:

a computer, the computer programmed to perform the steps of:

(A) acquiring a length of said slot;

(B) acquiring a length of one or more wedges;

(C) calculating a number of said one or more wedges required for said slot using the length of the slot and the length of the one or more wedges;

(D) calculating an end spacing distance ($L_{ES}$) with the following equation:

$$L_{ES}=L_{EP}=L_{CV}/2$$

where, $L_{EP}$ is the end packet length, $L_{CV}$ is the cooling vent length; and a display device for receiving and subsequently displaying the number of said one or more wedges required for said slot.

10. The system according to claim 9, said computer further programmed to calculate a middle spacing distance ($L_{MS}$) with the following equation:

$$L_{MS}=((L_S=(2*L_{ES}))/(N_{CV}-1))$$

where, $L_S$ is the length of said slot;

$L_{ES}$ is the end spacing distance; and $N_{CV}$ is a number of cooling vents in said slot.

11. The system according to claim 10, said computer further programmed to perform a determining step to determine if said number of wedges is an integer value.

12. The system according to claim 11, said computer further programmed to calculate a number of body wedges ($N_{BW}$) with the following equation:

$$N_{BW} = \left(\frac{L_S - L_{EW1} - L_{EW2} - L_{2W1} - L_{2W2.}}{L_{BW}}\right).$$

where, $L_S$ is the length of said slot;

$L_{EW1}$ is the length of an end wedge;

$L_{EW2}$ is the length of an end wedge;

$L_{2W1}$ is the length of a second wedge;

$L_{2W2}$ is the length of a second wedge;

$L_{BW}$ is a body wedge length; and wherein, $L_{2W1}$ and $L_{2W2}$ are set equal to zero if no second wedges are present.

13. The system according to claim 10, said computer further programmed to perform a determining step to determine if said number of wedges is an integer value.

14. The system according to claim 13, said computer further programmed to calculate a number of body wedges ($N_{BW}$) with the following equation:

$$N_{BW} = \left(\frac{L_S - L_{EW1} - L_{EW2} - L_{2W1} - L_{2W2.}}{L_{BW}}\right).$$

where, $L_S$ is the length of said slot;

$L_{EW1}$ is the length of an end wedge;

$L_{EW2}$ is the length of an end wedge;

$L_{2W1}$ is the length of a second wedge;

$L_{2W2}$ is the length of a second wedge;

$L_{BW}$ is a body wedge length; and wherein, $L_{2W1}$ and $L_{2W2}$ are set equal to zero if no second wedges are present.

* * * * *